(12) United States Patent
Yang

(10) Patent No.: US 6,457,163 B1
(45) Date of Patent: Sep. 24, 2002

(54) METHOD AND SYSTEM FOR CONSTRUCTING AND MANIPULATING A PHYSICAL INTEGRATED CIRCUIT LAYOUT OF A MULTIPLE-GATE SEMICONDUCTOR DEVICE

(75) Inventor: Lu-Tsann Yang, Hsinchu (TW)

(73) Assignee: Spring Soft Inc., Hsinchu (TW)

( * ) Notice: Subject to any disclaimer, the term of this patent is extended or adjusted under 35 U.S.C. 154(b) by 0 days.

(21) Appl. No.: 09/480,063

(22) Filed: Jan. 10, 2000

(51) Int. Cl.$^7$ .............................................. G06F 17/50
(52) U.S. Cl. ................. 716/8; 716/11; 716/2; 716/5
(58) Field of Search ........................ 716/1–14

(56) References Cited

U.S. PATENT DOCUMENTS

| | | | | |
|---|---|---|---|---|
| 5,620,916 A | * | 4/1997 | Eden et al. ................. | 364/491 |
| 5,625,568 A | * | 4/1997 | Edwards et al. ............ | 364/491 |
| 5,987,086 A | * | 11/1999 | Raman et al. ............... | 716/1 |
| 6,194,252 B1 | * | 2/2001 | Yamaguchi ................. | 438/129 |
| 6,209,123 B1 | * | 3/2001 | Maziasz et al. ............. | 716/14 |

OTHER PUBLICATIONS

Saika et al, "A Two–Dimensional Transistor Placement for Cell Synthesis", IEEE, Jan. 1997, pp. 557–562.*

* cited by examiner

*Primary Examiner*—Vuthe Siek
(74) *Attorney, Agent, or Firm*—Trop, Pruner & Hu, P.C.

(57) ABSTRACT

In a method and system for the automated construction and manipulation of a physical integrated circuit layout of a multiple-gate semiconductor device, wherein the layout is comprised of a plurality of gate glue-blocks interconnected by a plurality of active-layer glue-blocks, working shapes of the gate glue-blocks are initially created according to user-defined gate glue-block parameters. Thereafter, working shapes of the active-layer glue-blocks are created in accordance with the working shapes of adjacent ones of the gate glue-blocks, in which the distances among the working shapes exceed minimum geometrical distances as defined by relevant design rules of an applied fabrication technology.

48 Claims, 16 Drawing Sheets

METHOD AND SYSTEM FOR CONSTRUCTING AND MANIPULATING A PHYSICAL INTEGRATED CIRCUIT LAYOUT OF A MULTIPLE-GATE SEMICONDUCTOR DEVICE

BACKGROUND OF THE INVENTION

1. Field of the Invention

The invention relates to electronic design automation (EDA) tools for physical integrated circuit (IC) layouts, more particularly to a method and system for constructing and manipulating the physical IC layout of a multiple-gate semiconductor device.

2. Description of the Related Art

Hierarchical decomposition technology is typically applied by IC layout designers in the construction of IC layouts. The library is the highest level in an IC layout hierarchical organization, and is composed of a cluster of cells. The cell is the second hierarchical level in such an organization, and is composed of several multiple-gate semiconductor devices. The multiple-gate semiconductor device (hereinafter referred to as MG device) is the basic unit of an IC layout, and represents several transistors sharing a common thin-oxide layer. Referring to FIG. 1, a two-gate MG device is manufactured using conventional metal oxide semiconductor (MOS) fabrication technology, and is shown to have a thin-oxide layer 10, and a polysilicon layer 11 that overlaps thin-oxide layer 10 to form gate areas 12, which serve as MOS transistor channel areas. Metal layer 13 is disposed inside thin-oxide layer 10 but does not overlap with gate areas 12. Contact layer 14 is enclosed by metal layer 13 and functions as a pin area, which is a point of connection to other metal-connected regions, for the MG device. The geometrical distances among the shapes of the different layers are constrained by design rules of a fabrication technology that are defined in a fabrication technology file. Due to process precision limitations during IC fabrication, the geometrical distances among the shapes of the different layers should exceed the design rule values to increase the IC production yield.

Referring to FIG. 2, a polygon-based layout editor is generally used to construct the IC layout of the MG device. After drawing the IC layout, design rule checking (DRC) is performed to validate the IC layout. If a design rule violation is detected, the process reverts to the layout editor for correcting the design rule violation. Because the conventional polygon-based layout editor only provides primitive polygon-drawing commands, it is error-prone, and several iteration steps may have to be performed to correct all design rule violations. The conventional method of constructing the IC layouts of MG devices with the use of the polygon-based layout editor is thus tedious, labor intensive, and time consuming.

SUMMARY OF THE INVENTION

Therefore, the object of the present invention is to provide a method and system for constructing and manipulating a physical IC layout of a multiple-gate semiconductor device, the method and system allowing the simultaneous creation and correction of the IC layout of the multiple-gate semiconductor device to ensure that relevant design rules defined in a fabrication technology file can be fulfilled without the need for a subsequent design rule checking operation, thereby improving the IC layout productivity.

According to one aspect of the present invention, a method for constructing and manipulating a physical integrated circuit layout of a multiple-gate semiconductor device, wherein the layout is comprised of a plurality of gate glue-blocks interconnected by a plurality of active-layer glue-blocks, comprises the machine-executed steps of:

importing user-defined gate glue-block parameters from a user input device;

creating working shapes of the gate glue-blocks according to the user-defined gate glue-block parameters;

creating working shapes of the active-layer glue-blocks in accordance with the working shapes of adjacent ones of the gate glue-blocks, including the machine-executed steps of: extracting relevant design rules of an applied fabrication technology from a fabrication technology file to determine minimum geometrical distances among the working shapes; and creating the working shapes of the active-layer glue-blocks such that the distances among the working shapes exceed the minimum geometrical distances as defined by the relevant design rules; and showing the layout thus constructed on a computer monitor.

According to another aspect of the present invention, a system for the automated construction and manipulation of a physical integrated circuit layout of a multiple-gate semiconductor device, wherein the layout is comprised of a plurality of gate glue-blocks interconnected by a plurality of active-layer glue-blocks, comprises:

a monitor for showing the layout thereon;

a user input device operable so as to provide user-defined gate glue-block parameters; and a shape creator connected to the monitor and the user input device and operable so as to create the layout shown on the monitor, the shape creator including: a gate glue-block creator for creating working shapes of the gate glue-blocks according to the user-defined gate glue-block parameters imported from the user input device; and an active-layer glue-block creator, associated operably with the gate glue-block creator, for creating working shapes of the active-layer glue-blocks in accordance with the working shapes of adjacent ones of the gate glue-blocks, wherein the distances among the working shapes exceed minimum geometrical distances as defined by relevant design rules of an applied fabrication technology.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
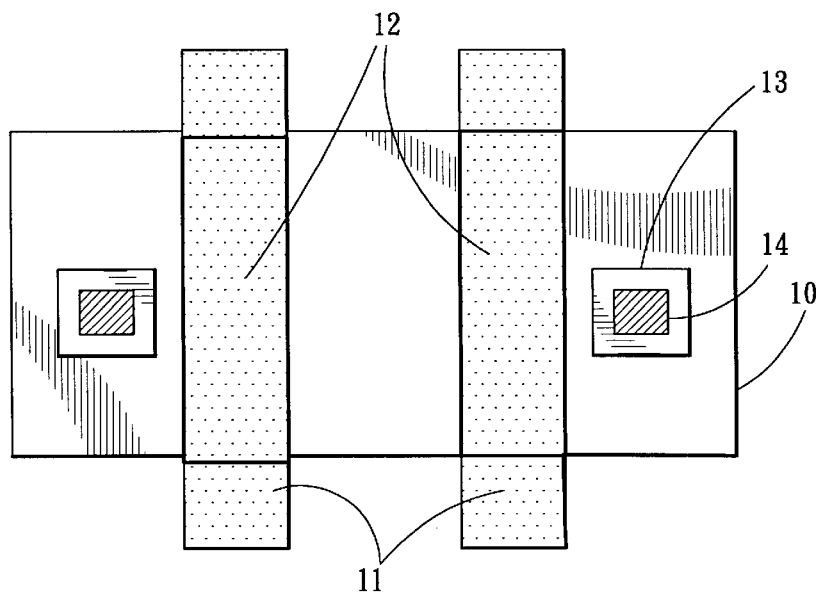
FIG. 1 illustrates an integrated circuit layout of a conventional two-gate semiconductor device.
Figure 3:
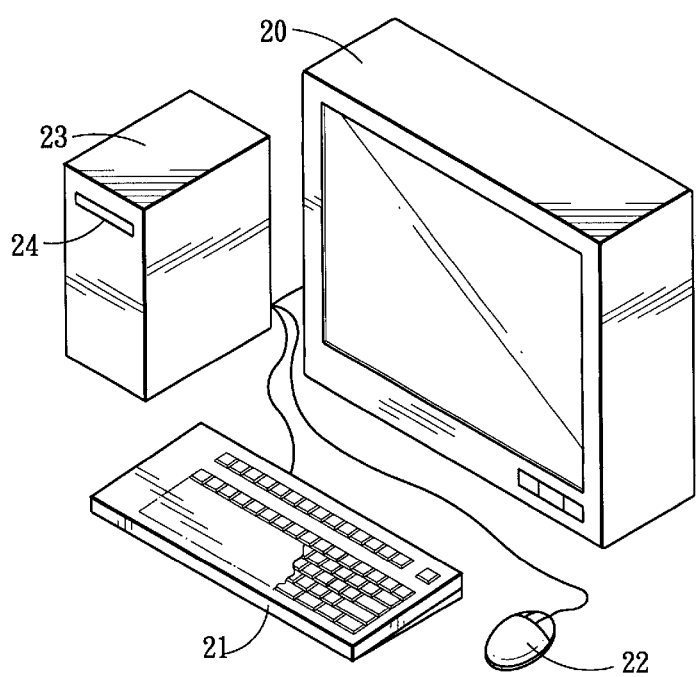
FIG. 3 illustrates an exemplary CAD workstation where the method and system of the present invention reside.
Figure 2:
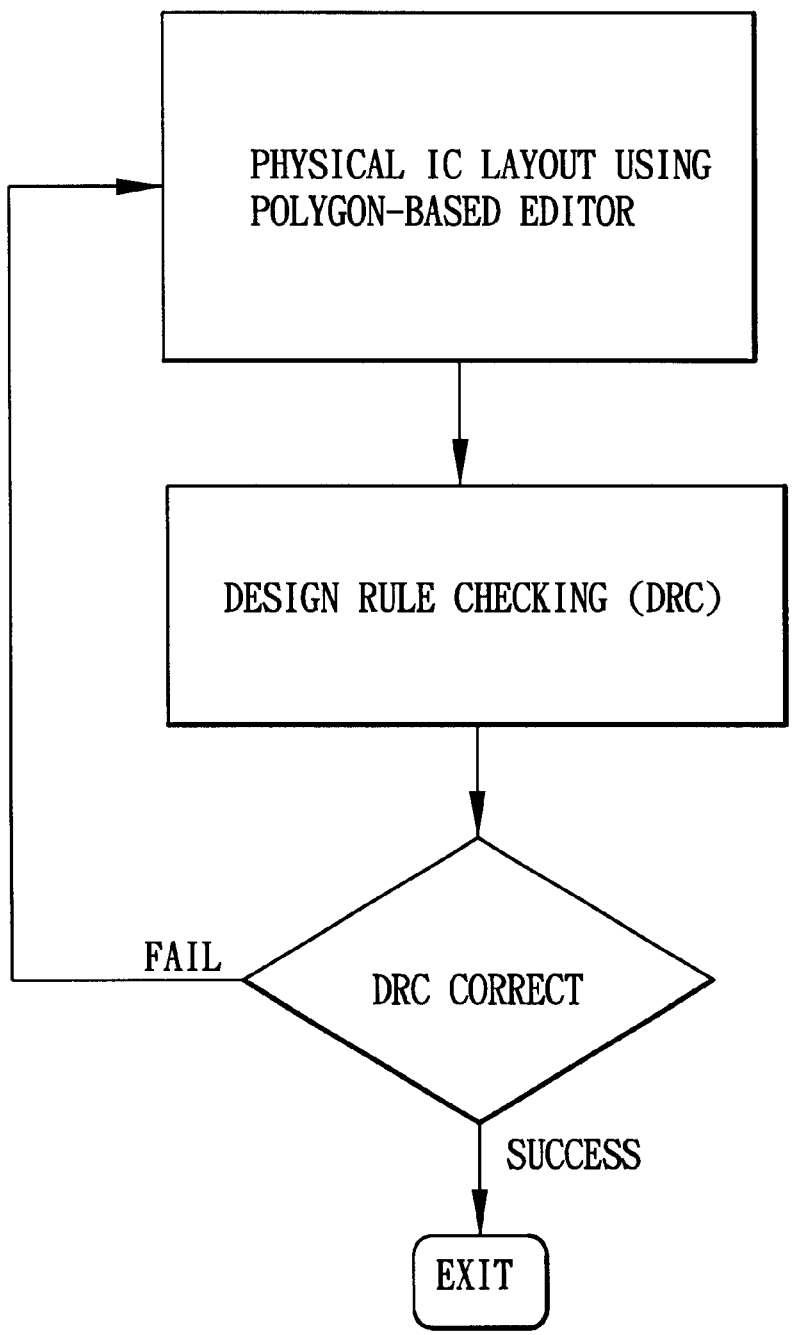
FIG. 2 is a flowchart illustrating how an integrated circuit layout is constructed using a conventional polygon-based layout editor.

The method of the present invention is implemented within a CAD environment, and typically resides in an electronic data storage medium inside a computer workstation. FIG. 3 illustrates a typical computer workstation dedicated to VLSI CAD tasks. The computer workstation houses various CAD tools ranging from synthesis and circuit simulation to layout design tools, and comprises a monitor 20, a keyboard 21 and a mouse 22 that serve as a user input device, and a cabinet 23. There are many components on the cabinet 23, such as a floppy disk drive 24, a CD-ROM drive, a hard disk drive, processors, and memory and network devices (not shown). CAD tools, in which the method of the present invention is incorporated, can be stored in and retrieved from among the different storage devices during use.

Figure 16:
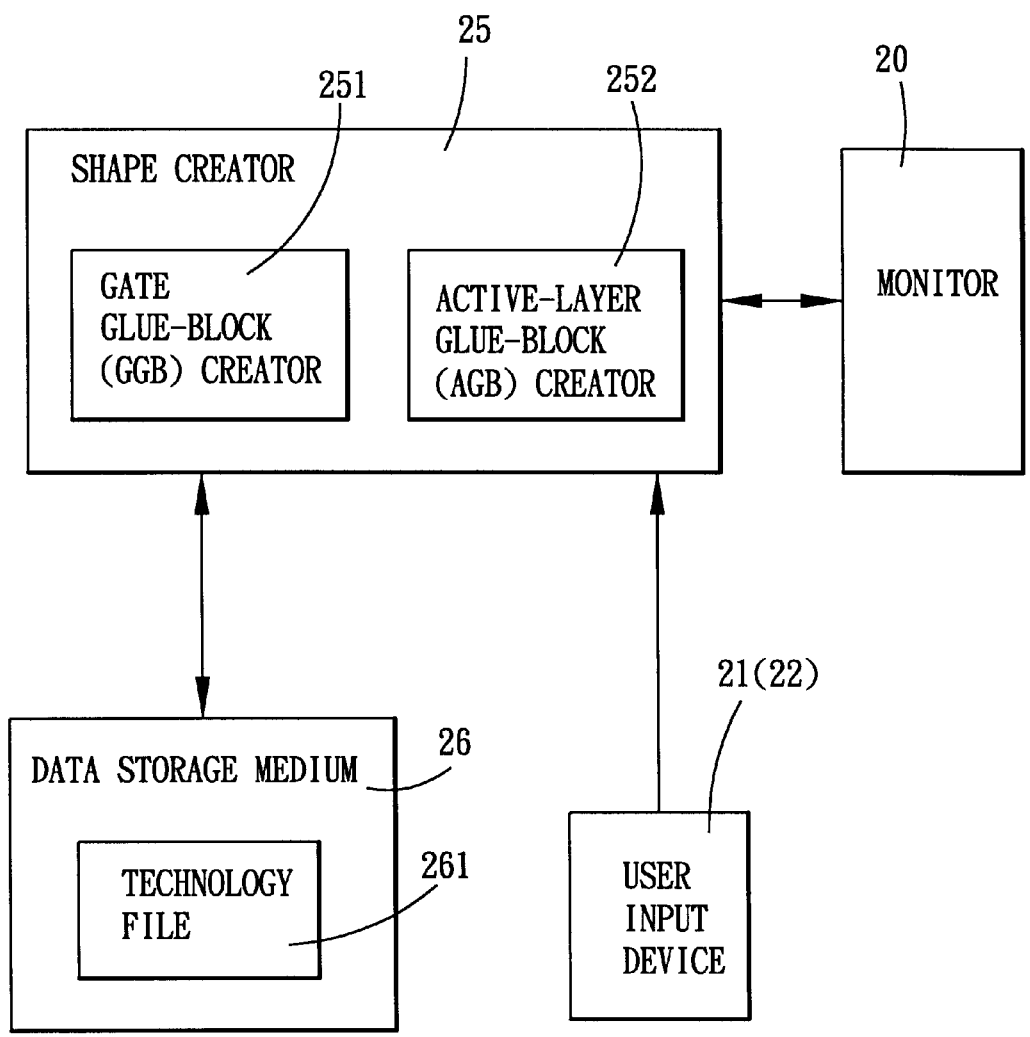
FIG. 16 is a block diagram of the system of the preferred embodiment.

Referring to FIG. 16, when the computer workstation of FIG. 3 implements the method of the present invention, the processing system thereof will be configured to include a shape creator 25 having a gate glue-block creator 251 and an active-layer glue-block creator 252, the purposes of which will be described in greater detail in the succeeding paragraphs.

Figure 4:
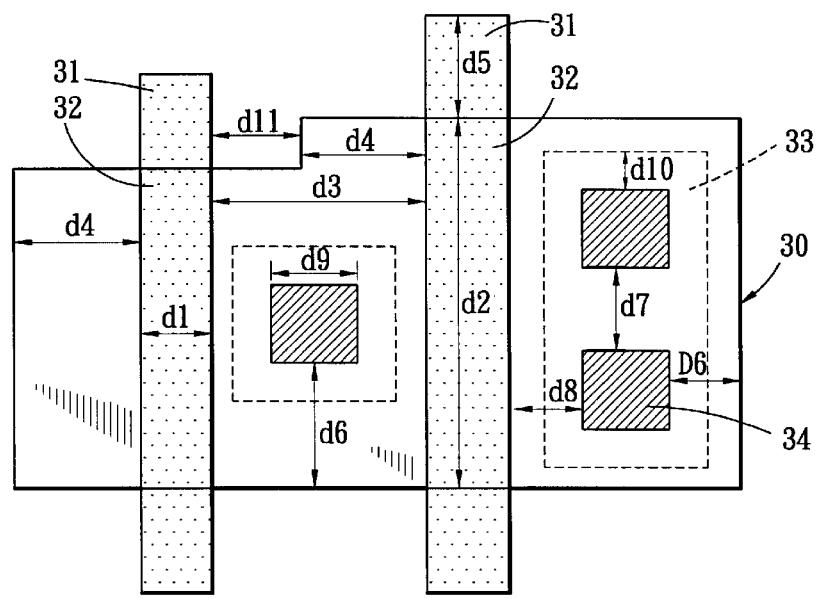
FIG. 4 illustrates the integrated circuit layout of a two-gate semiconductor device, and the relevant design rules therefor in accordance with the present invention.

As mentioned hereinbefore, design rules are critical constraints based on process precision limitations during IC fabrication. Typically, the number of design rules will exceed a hundred for common CMOS technology. However, not all design rules are applicable to MG devices. Particularly, only eleven design rules are relevant to MG devices and constitute the MG design rule set (hereinafter referred to as MG-DRS). The MG-DRS is described as follows with reference to FIG. 4, which illustrates a two-gate MG device having distances that exceed minimum geometrical distances as defined by the MG-DRS:

1. d1 indicates the minimum width of a gate area 32, and is typically 0.35 micron for 0.35 micron CMOS fabrication technology.
2. d2 indicates the minimum length of a gate area 32, and is typically 0.4 micron for 0.35 micron CMOS fabrication technology.
3. d3 indicates the minimum distance between adjacent gate areas 32, and is typically 0.45 micron for 0.35 micron CMOS fabrication technology.
4. d4 indicates the minimum distance between a gate area 32 and an adjacent edge of the thin-oxide layer 30, and measured internally of the thin-oxide layer 30 in the widthwise direction. d4 is typically 0.5 micron for 0.35 micron CMOS fabrication technology.
5. d5 indicates the minimum length of a polysilicon extension 31 that extends beyond the thin-oxide layer 30, and is typically 0.4 micron for 0.35 CMOS micron fabrication technology.
6. d6 indicates the minimum distance between a contact layer 34 and an adjacent edge of the thin-oxide layer 30, and is typically 0.45 micron for 0.35 micron CMOS fabrication technology.
7. d7 indicates the minimum distance between adjacent contact layers 34, and is typically 0.4 micron for 0.35 micron CMOS fabrication technology.
8. d8 indicates the minimum distance between a contact layer 34 and an adjacent gate area 32, and is typically 0.3 micron for 0.35 micron CMOS fabrication technology.
9. d9 indicates the minimum width of a contact layer 34, and is typically 0.4 micron for 0.35 micron CMOS fabrication technology.
10. d10 indicates the minimum distance between a contact layer 34 and an adjacent edge of a metal layer 33, and measured internally of the metal layer 33. d10 is typically 0.15 micron for 0.35 micron CMOS fabrication technology.
11. d11 indicates the minimum distance between a polysilicon extension 31 and an adjacent edge of the thin-oxide layer 30, and measured externally of the thin-oxide layer 30 in the widthwise direction. d11 is typically 0.2 micron for 0.35 CMOS micron fabrication technology.

Figure 5:
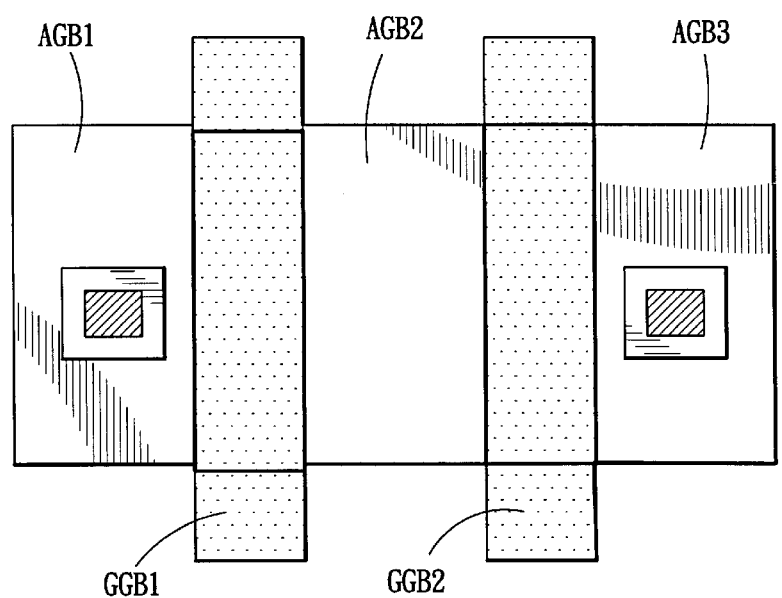
FIG. 5 illustrates how gate and active-layer glue-blocks comprise the integrated circuit layout of a two-gate semiconductor device in accordance with the present invention.

According to the present invention, the IC layout of a MG device is comprised of two basic types of building block units (hereinafter referred to as glue-blocks). The active-layer glue-block (hereinafter referred to as AGB) represents the physical transistor source/drain area at the thin-oxide layer. The gate glue-block (hereinafter referred to as GGB)

represents the transistor channel area. FIG. 5 illustrates the IC layout of a two-gate MG device. The layout comprises first and second GGBs (GGB1, GGB2) that are interconnected by first, second and third AGBs (AGB1, AGB2, AGB3).

Figure 6:
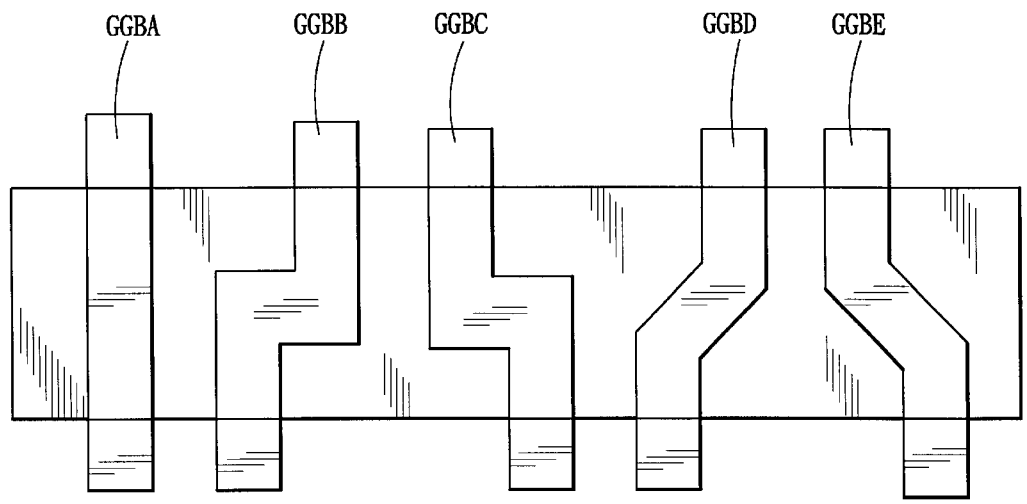
FIG. 6 illustrates the integrated circuit layout of a multiple-gate semiconductor device with five gate glue-blocks having working shapes of five different gate patterns.

FIG. 6 illustrates the IC layout of a five-gate MG device with five GGBs having working shapes of five different gate patterns GGBA, GGBB, GGBC, GGBD, GGBE, respectively. By providing different gate patterns, a highly flexible aspect ratio can be obtained to achieve an optimum total layout area.

Figure 7:
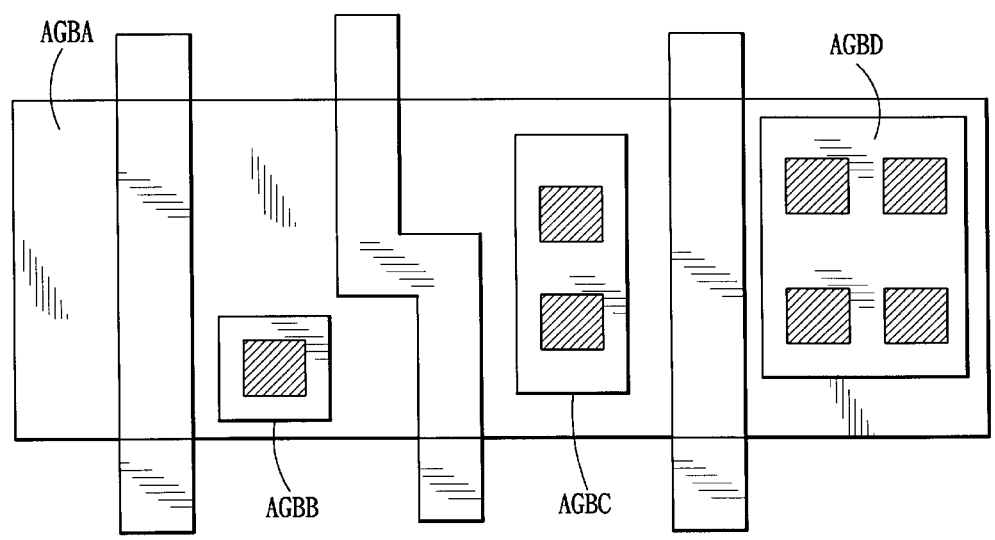
FIG. 7 illustrates the integrated circuit layout of a multiple-gate semiconductor device with four different kinds of active-layer glue-blocks.

FIG. 7 illustrates the IC layout of a three-gate MG device that incorporates four different types of AGBs. The first AGB type (AGBA) is a contactless AGB, e.g. an AGB with no contact therein. The second AGB type (AGBB) is a single-contact AGB, e.g. an AGB with only a single contact existing therein. The third AGB type (AGBC) includes a user-defined array of contacts. In FIG. 7, the third AGB type (AGBC) is shown to have a 1×2 array of contacts defined by the user. The fourth AGB type (AGED) is a maximum-contact AGB, e.g. an AGB having a contact array with a maximum number of contacts that meets the minimum geometrical distances as defined by the relevant design rules. The fourth AGB type (AGED) is useful for improving the quality of connection between the metal and contact layers.

The method and system of the present invention are mainly concerned with the working shapes of the AGBs and GGBs. Since the internal data mechanisms of the AGBs and GGBs are known in the art, the manner of physical binding between AGBs and GGBs should be clear to those skilled in the art and will not be detailed herein for the sake of brevity. By using the concept of AGBs and GGBs as taught by the present invention in an IC layout, the construction of the layout of complex MG devices can be facilitated. Note that a change in the working shape of one of the GGBs will only affect the adjacent ones of the AGBs, and will not affect the other GGBs and the distant AGBs.

Figure 17A:
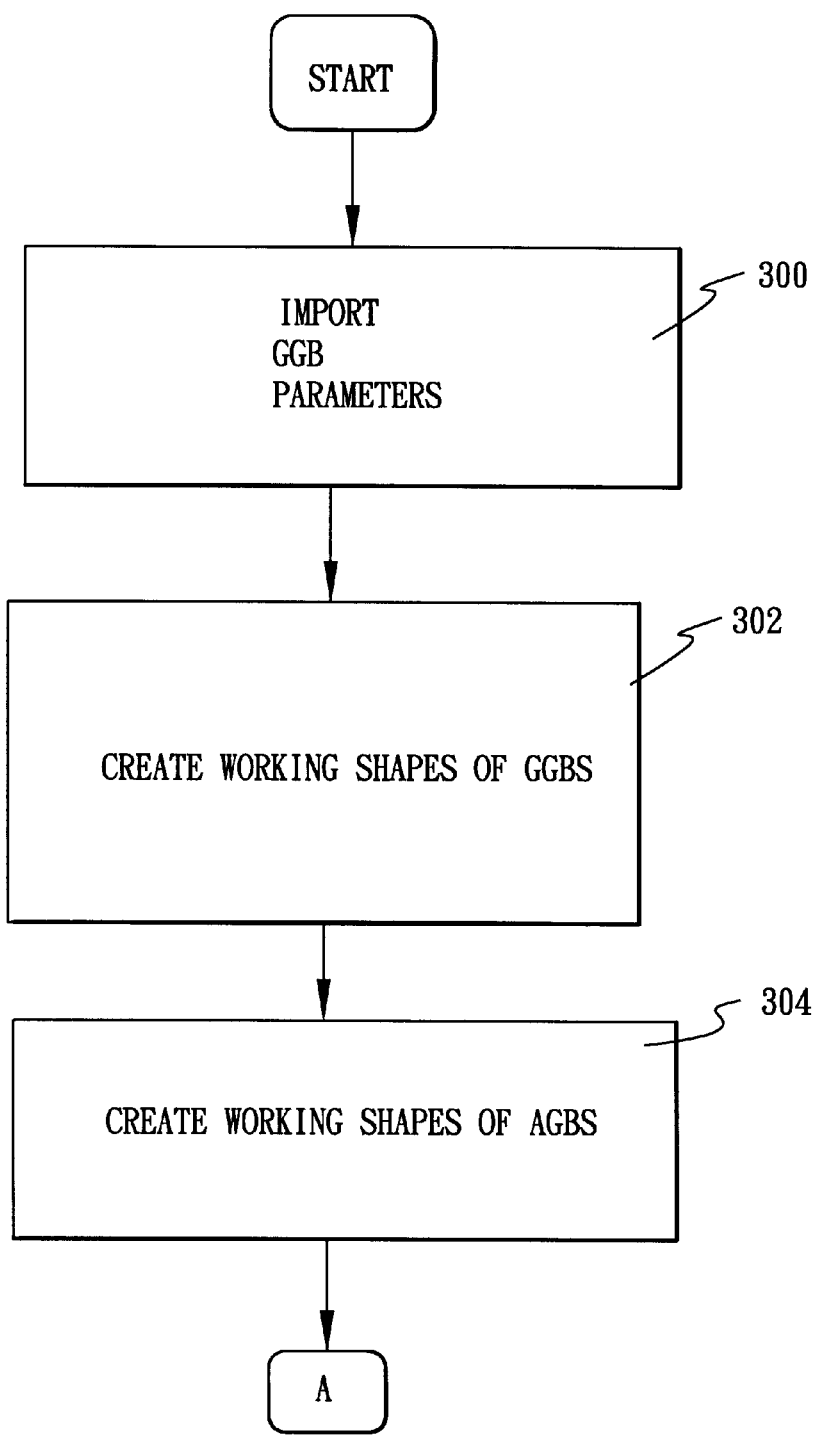
FIGS. 17A and 17B are flowcharts of the layout constructing operation according to the method of the preferred embodiment.
Figure 17B:
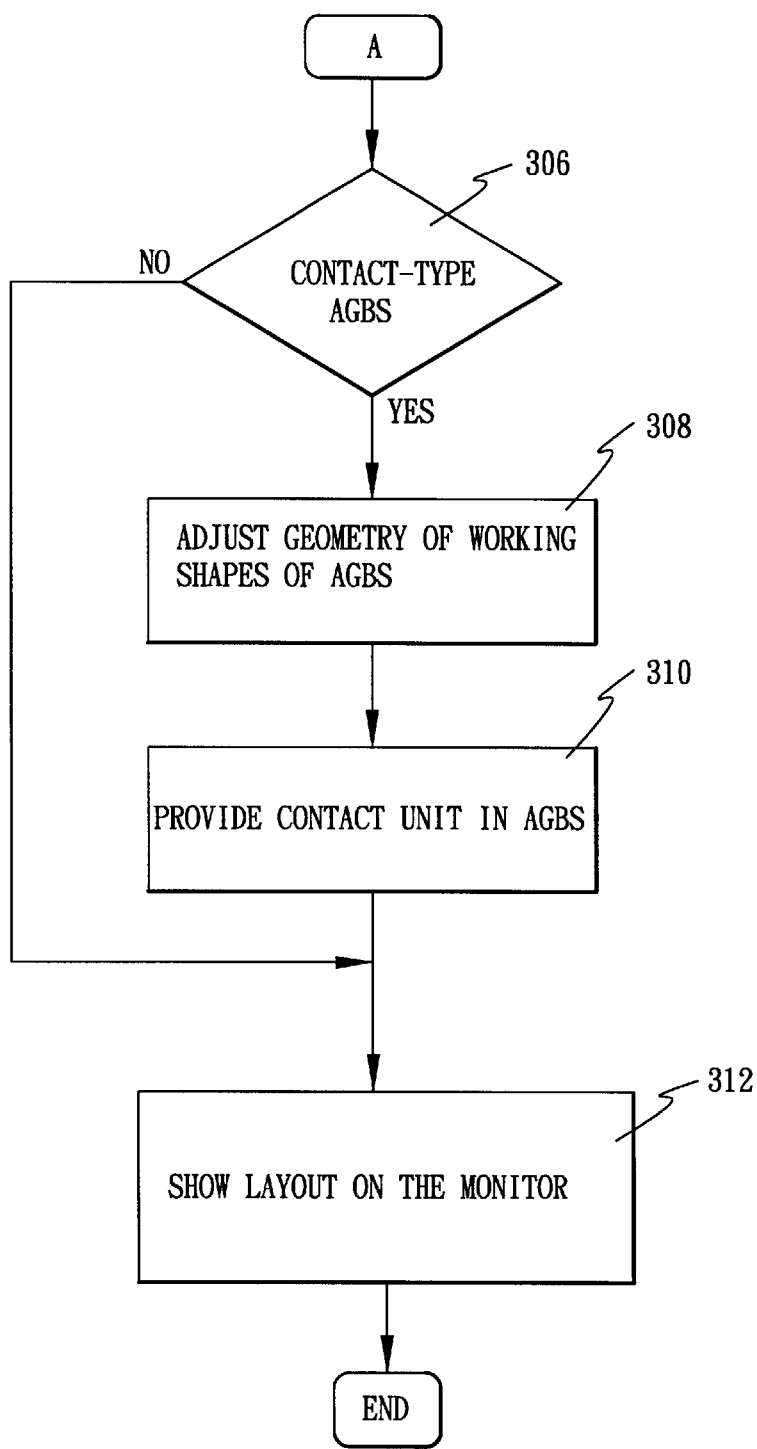

FIGS. 17A and 17B are flow charts illustrating the layout constructing operation of the method of the preferred embodiment. The method begins with the importing of user-defined GGB parameters from the user input device, e.g. the keyboard 21 of FIG. 3, by the shape creator 25 (see FIG. 16) at step 300. The user-defined GGB parameters include lengths (GLn, where n is the order of the GGB in the layout) and widths (GWn) of the working shapes of the GGBs, the gate patterns (GGBm, where m is any one of A, B, C, D and E) of the GGBs, and offset values (GOFFn) for the working shapes of the GGBs. The offset value (GOFFn) is a distance to be formed in the lengthwise direction between an edge of the working shape of one of the GGBs and an edge of the working shape of an adjacent one of the GGBs.

In step 302, the GGB creator 251 (see FIG. 16) automatically creates the working shapes of the GGBs according to the user-defined GGB parameters. Thereafter, in step 304, the AGB creator 252 (see FIG. 16) automatically creates the working shapes of the AGBs in accordance with the working shapes of adjacent ones of the GGBs. Referring again to FIG. 16, the design rules of the applied fabrication technology can be found in a fabrication technology file 261 that is stored in an electronic data storage medium 26 and that is accessible to the shape creator 25. When the AGB creator 252 creates the working shapes of the AGBs, the relevant design rules or the MG-DRS are extracted from the fabrication technology file 261, and the working shapes of the AGBs are subsequently created such that the distances among the working shapes of the GGBs and AGBs exceed the minimum geometrical distances as defined by the MG-DRS.

In the preferred embodiment, the AGB type (e.g. contactless, single-contact, user-defined, or maximum-contact) for each of the AGBs can be defined by the user simultaneous with the defining of the GGB parameters. Thus, as shown in FIG. 17B, the AGB type for each of the AGBs is inspected in step 306 to determine the presence of contact-type AGBs. Then, in step 308, the AGB creator 252 (see FIG. 16) adjusts the geometry of the working shapes of the AGBs that are to be provided with a contact unit to ensure the presence of a contact area which is sufficient to accommodate the contact unit therein such that the distances between the contact unit and the working shapes of the GGBs and the AGBs exceed the minimum geometrical distances as defined by the MG-DRS. Subsequently, in step 310, the AGB creator 252 provides the appropriate contact unit inside the working shapes of the contact-type AGBs. Finally, in step 312, the IC layout thus constructed by the shape creator 25 is shown on the monitor 20.

Figure 8:
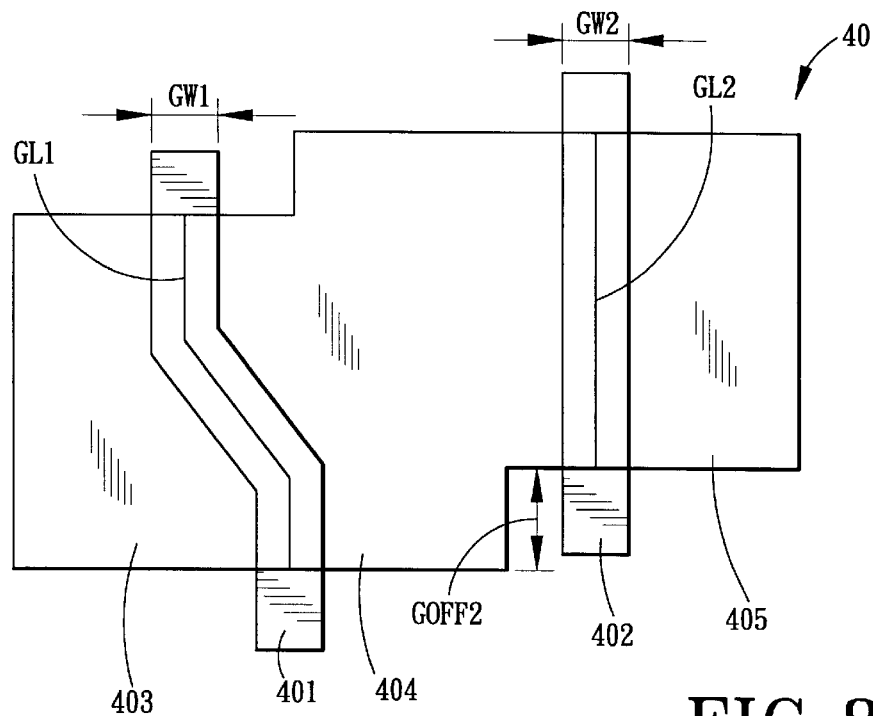
FIG. 8 illustrates one example of an integrated circuit layout constructed according to the method and system of the preferred embodiment.

FIG. 8 illustrates an IC layout 40 constructed according to the method and system of the preferred embodiment. The first GGB 401 has the following user-defined GGB parameters: GL1=3.5, GW1=0.35, GatePattern1=GGBE, and GOFF1=0. The offset value for the first GGB in any layout according to the present invention is always 0. The second GGB 402 has the following user-defined GGB parameters: GL2=2.9, GW2=0.4, GatePattern2=GGBA, and GOFF2=0.3. The working shapes of the first, second and third AGBs 403, 404, 405, which are contactless AGBs, are automatically created by the shape creator 25 (see FIG. 16) to interconnect the first and second GGBs 401, 402. The first and second GGBs 401, 402 and the first, second and third AGBs 403, 404, 405 cooperatively form the layout of a two-gate MG device.

Figure 9:
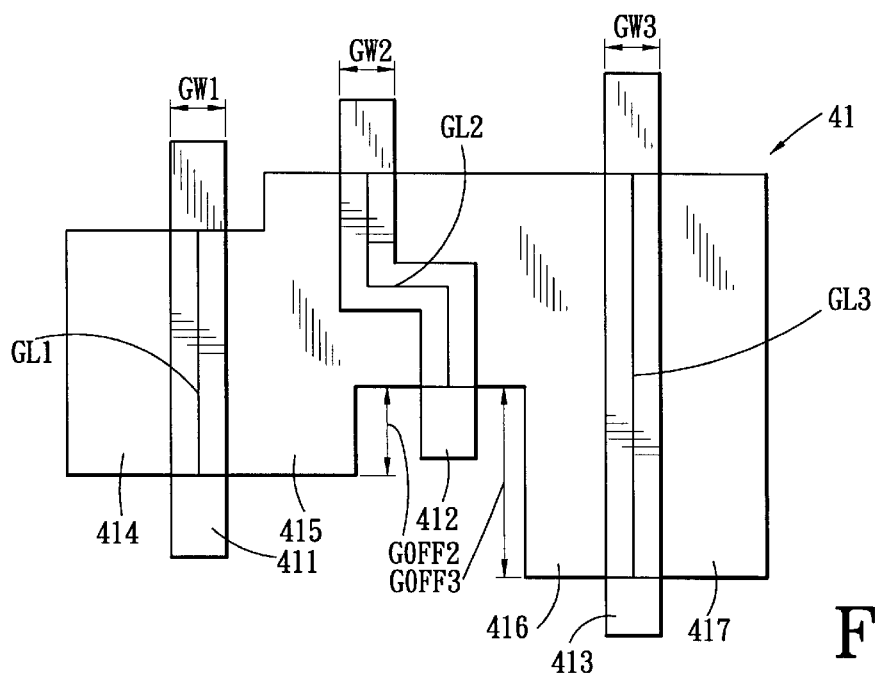
FIG. 9 illustrates another example of an integrated circuit layout constructed according to the method and system of the preferred embodiment.

FIG. 9 illustrates another IC layout 41 constructed according to the method and system of the preferred embodiment. The first GGB 411 has the following user-defined GGB parameters: GL1=3.0, GW1=0.45, GatePatternl=GGBA, and GOFF1=0. The second GGB 412 has the following user-defined GGB parameters: GL2=3.2, GW2=0.35, GatePattern2=GGBC, and GOFF2=1.0. The third GGB 413 has the following user-defined GGB parameters: GL3=5.6, GW3=0.47, GatePattern3=GGBA, and GOFF3=2.0. The working shapes of the first, second and third and fourth AGBs 414, 415, 416, 417, which are contactless AGBs, are automatically created by the shape creator 25 (see FIG. 16) to interconnect the first, second and third GGBs 411, 412, 413. The first, second and third GGBs 411, 412, 413 and the first, second, third and fourth AGBs 414, 415, 416 cooperatively form the layout of a three-gate MG device.

Because the MG-DRS is applied during the layout construction operation, the IC layout from the shape creator 25 will meet the MG-DRS requirements and will be free of any design rule violation, thereby dramatically reducing the difficulty involved in the construction of layouts of MG devices.

Due to the complexity of MG devices, it is difficult to create the ideal IC layout therefor at first try by mere reliance upon the user-defined GGB parameters. There is a need to manipulate or edit the IC layout to tailor the GGBs and AGBs that comprise the same so as to attain the desired final IC layout without using a lower-level polygon-drawing scheme.

In the method and system of the present invention, the user is allowed to manipulate the IC layout of a MG device in anyone of six different user-friendly ways: modifying the user-defined GGB parameters; modifying the AGB parameters; moving the working shapes of the GGBs; adjusting the geometry of the working shapes of the GGBs; splitting the IC layout; and merging two IC layouts.

Figure 10A:
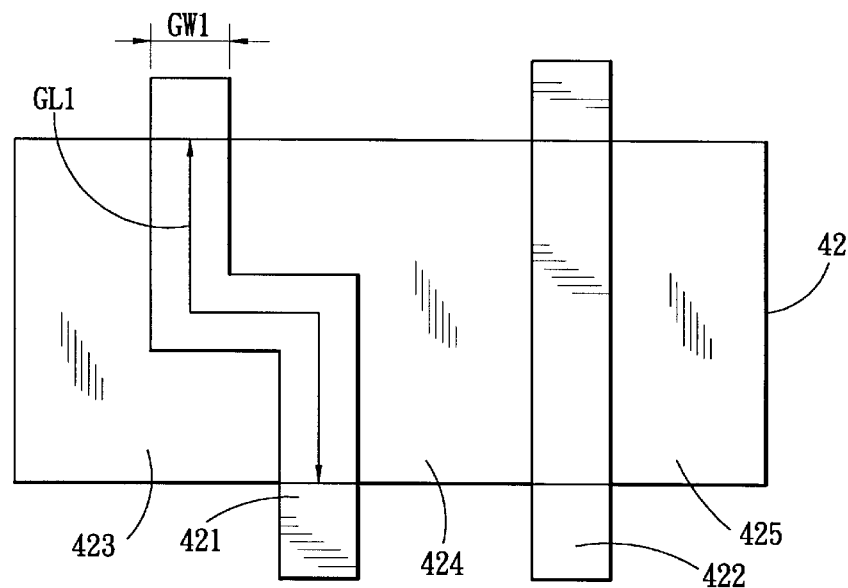
FIGS. 10A and 10B illustrate how an integrated circuit layout changes by modifying user-defined gate glue-block parameters in accordance with the method and system of the preferred embodiment.
Figure 10B:
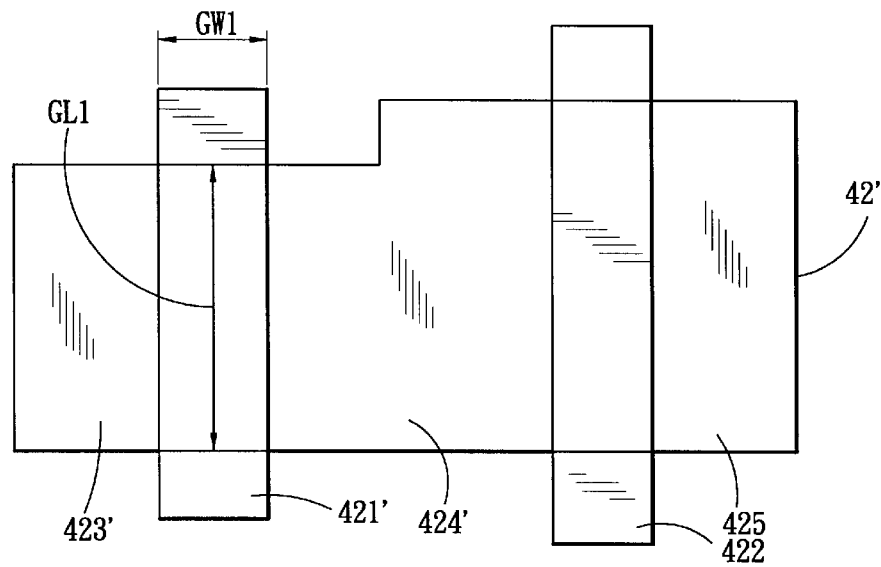

FIGS. 10A and 10B illustrate how an original IC layout 42 changes into an adjusted IC layout 42' by modifying the user-defined GGB parameters. In the original IC layout 42 shown in GIG. 10A, the user-defined parameters for the first GGB 421 are GL1=3.5, GW1=0.5, and GatePatternl= GGBC. When the user modifies the user-defined GGB parameters by operating the user input device, e.g. the keyboard 21 of FIG. 3, into GL1=2.5, GW1=0.75 and GatePatternl=GGBA, the GGB creator 251 (see FIG. 16) is controlled so as to adjust automatically the geometry of the working shape of the first GGB 421 according to the modified user-defined GGB parameters. The AGB creator 252 (see FIG. 16) is also controlled to adjust automatically the geometry of the working shapes of the first and second AGBs 423, 424, which are adjacent to the first GGB 421, in accordance with the working shape of the adjusted first GGB such that the distances among the working shapes exceed the minimum geometrical distances as defined by the MG-DRS. The adjusted first GGB 421' and the adjusted first and second AGBs 423', 424' are illustrated in the IC layout 42' of FIG. 10B, which is shown on the monitor 20 (see FIG. 16). Note that the adjustment made to the first GGB 421 does not affect the working shape of the second GGB 422 or the working shape of the third AGB 425.

Figure 11A:
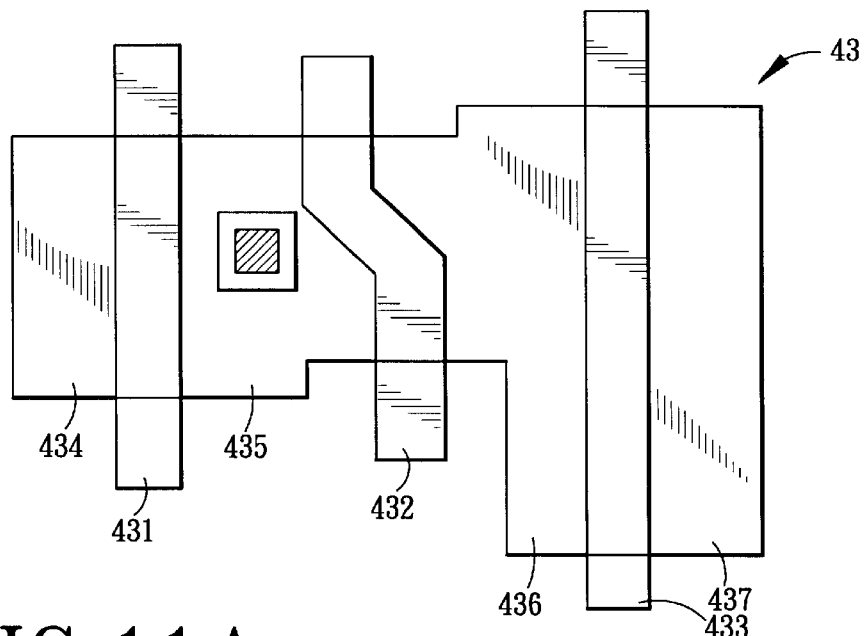
FIGS. 11A and 11B illustrate how an integrated circuit layout changes by modifying an active-layer glue-block thereof in accordance with the method and system of the preferred embodiment.
Figure 11B:
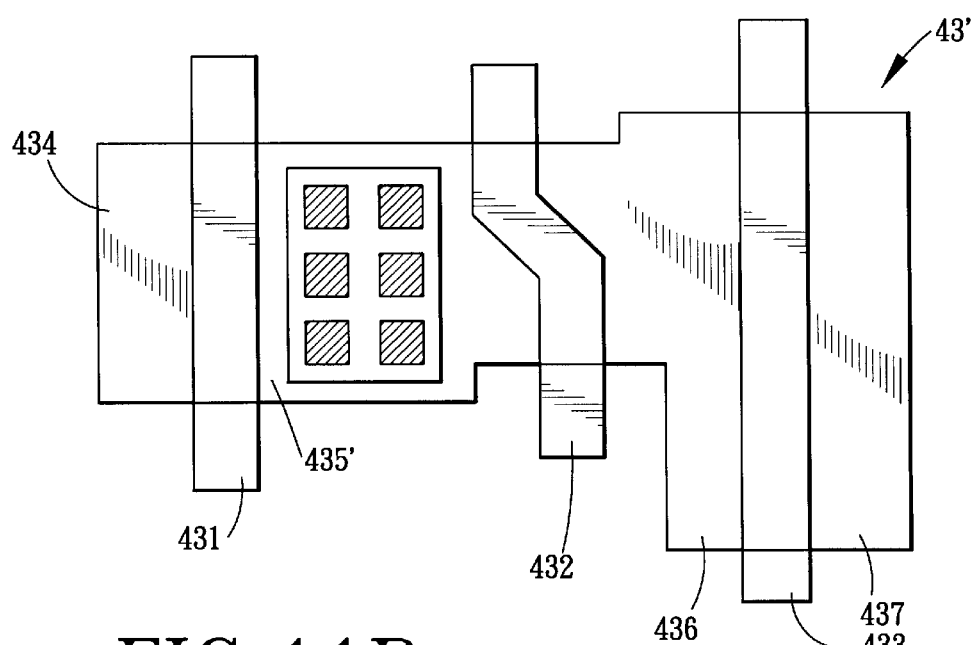

FIGS. 11A and 11B illustrate how an original IC layout 43 changes into an adjusted IC layout 43' by modifying the AGB parameters. In the original IC layout 43 shown in GIG. llA, the second AGB 435 is a single-contact type AGB having a width (or distance between the first and second GGBs 431, 432) of 4.0 micron. When the user modifies the parameters of the second AGB 435 through the user input device into a maximum contact type AGB having a width of 7.0 micron, the AGB creator 252 (see FIG. 16) is enabled so as to adjust automatically the geometry of the working shape of the second AGB 435 and so as to redefine the contact unit inside the working shape of the second AGB 435. The adjusted second AGB 435' is illustrated in the IC layout 43' of GIG. llB, which is shown on the monitor 20 (see FIG. 16). Note that the adjustment made to the second AGB 435 does not affect the working shapes of the first, second and third GGBs 431, 432, 433 or the working shapes of the first, third and fourth AGBs 434, 436, 437.

Figure 12:
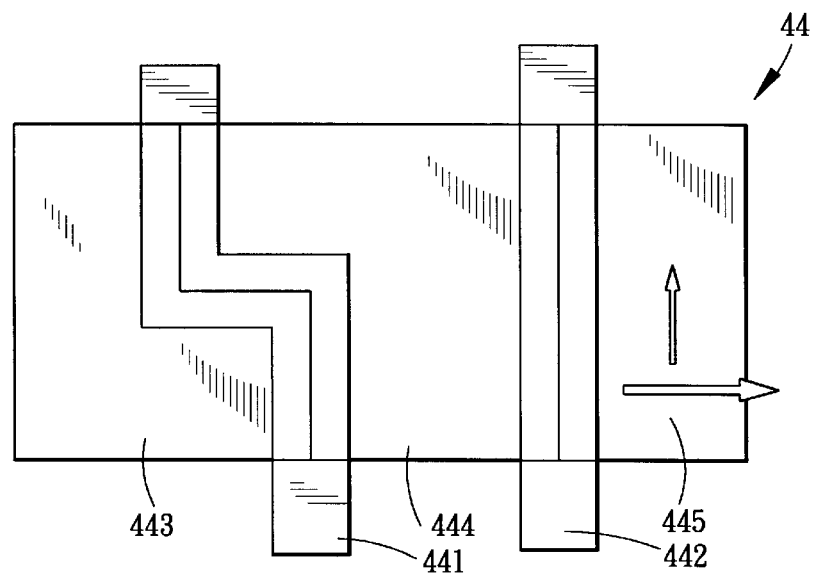
FIGS. 12A and 12B illustrate how an integrated circuit layout changes by moving the working shape of a gate glue-block thereof in accordance with the method and system of the preferred embodiment.
Figure 12:
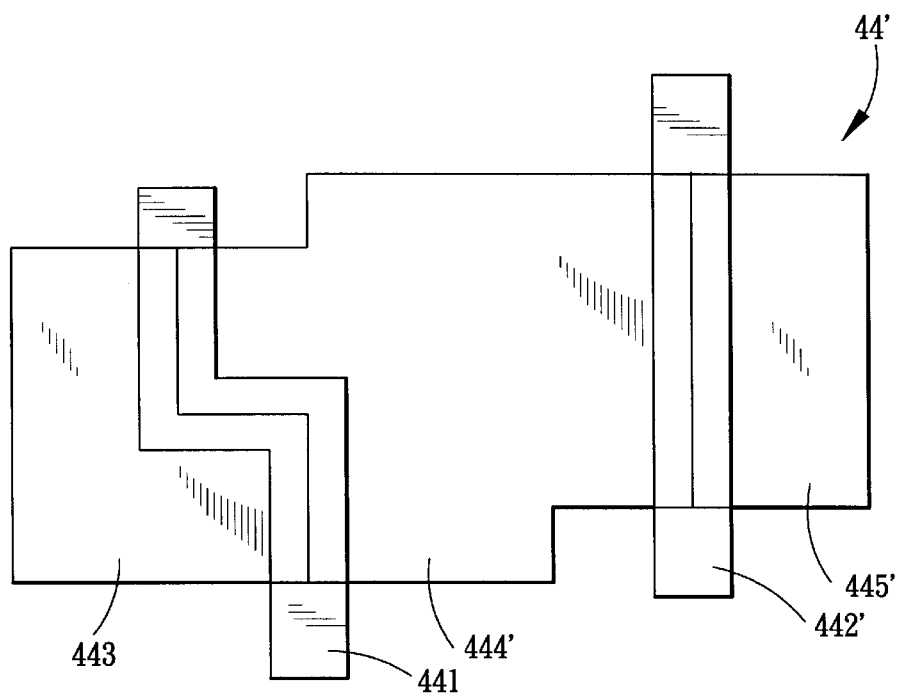

FIGS. 12A and 12B illustrate how an original IC layout 44 changes into an adjusted IC layout 44' by moving the working shape of a GGB thereof. In FIG. 12A, the user operates the user input device, e.g. the mouse 22 of FIG. 3, to control the GGB creator 251 (see FIG. 16) so as to move the working shape of the second GGB 442 up 0.3 micron and to the right 0.5 micron relative to the first GGB 441 using known click-and-drag techniques. The AGB creator 252 (see FIG. 16) is also controlled to adjust automatically the geometry of the working shapes of the second and third AGBs 444, 445, which are adjacent to the second GGB 442, in accordance with the new position of the working shape of the adjusted second GGB such that the distances among the working shapes exceed the minimum geometrical distances as defined by the MG-DRS. The adjusted second GGB 442' and the adjusted second and third AGBs 444', 445' are illustrated in the IC layout 44' of FIG. 12B, which is shown on the monitor 20 (see FIG. 16). The second AGB 444' has a width of 1.5 micron, which is 0.5 micron longer than the width of the second AGB 444 of the IC layout 44 shown in FIG. 12A. The second GGB 442' has a gate offset value of 0.3 micron, which is an increase of 0.3 micron from the gate offset value of the second GGB 442 of the IC layout 44. The adjustment made to the position of the second GGB 442 does not affect the working shape of the first GGB 441 or the working shape of the first AGB 443.

Figure 13:
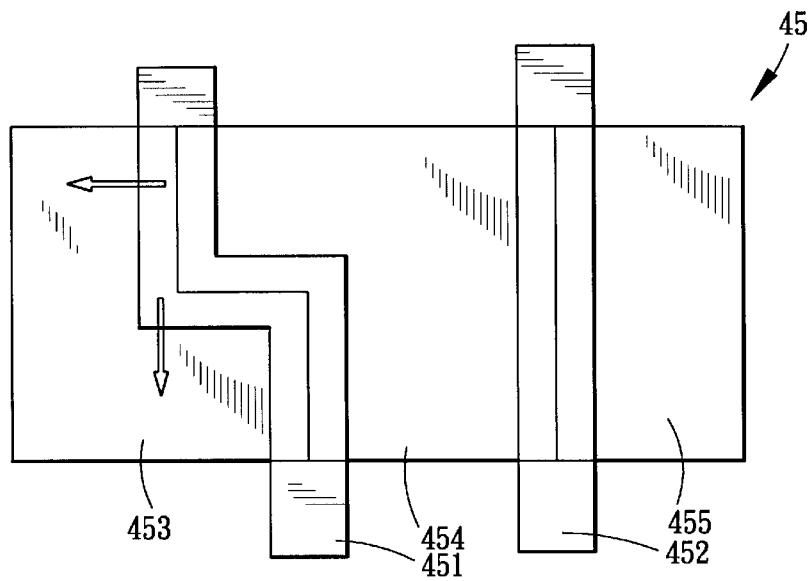
FIGS. 13A and 13B illustrate how an integrated circuit layout changes by adjusting the geometry of the working shape of a gate glue-block thereof in accordance with the method and system of the preferred embodiment.
Figure 13B:
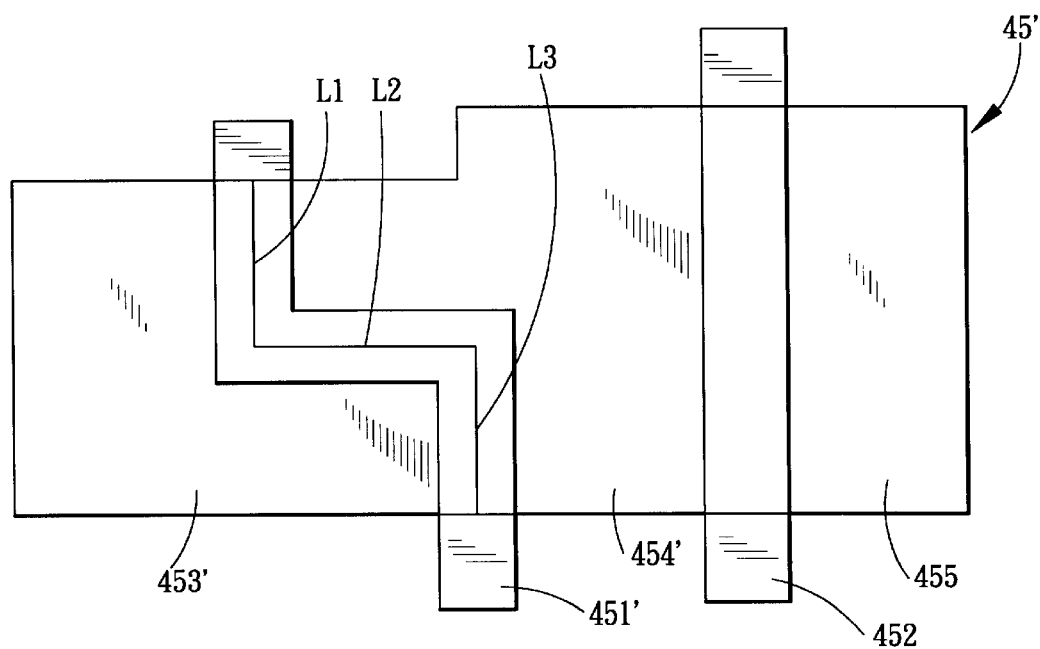

FIGS. 13A and 13B illustrate how an original IC layout 45 changes into an adjusted IC layout 45' by adjusting the geometry of the working shape of a GGB thereof. In FIG. 13A, the user operates the user input device, e.g. the mouse 22 of FIG. 3, to control the GGB creator 251 (see FIG. 16) so as to stretch the working shape of the first GGB 451 to the left 0.3 micron and down 0.4 micron using known click-and-drag techniques. The AGB creator 252 (see FIG. 16) is also controlled to adjust automatically the geometry of the working shapes of the first and second AGBs 453, 454, which are adjacent to the first GGB 451, in accordance with the working shape of the adjusted first GGB such that the distances among the working shapes exceed the minimum geometrical distances as defined by the MGDRS. The adjusted first GGB 451' and the adjusted first and second AGBs 453', 454' are illustrated in the IC layout 45' of FIG. 13B, which is shown on the monitor 20 (see FIG. 16). The length (L1) of a first section of the first GGB 451' is 1.4 micron, which is 0.1 micron longer than that of the first GGB 451 of the IC layout 45 of FIG. 13A. The length (L2) of a second section of the first GGB 451' is 1.3 micron, which is 0.3 micron longer than that of the first GGB 451. The length (L3) of a third section of the first GGB 451' is 1.1, which is 0.4 micron shorter than that of the first GGB 451. The adjustment made to the geometry of the working shape of the first GGB 451 does not affect the working shape of the second GGB 452 or the working shape of the third AGB 455.

It is noted that the geometry adjusting operation exemplified in FIGS. 13A and 13B is applicable to any GGB that does not have the gate pattern GGBA of FIG. 6.

Figure 14:
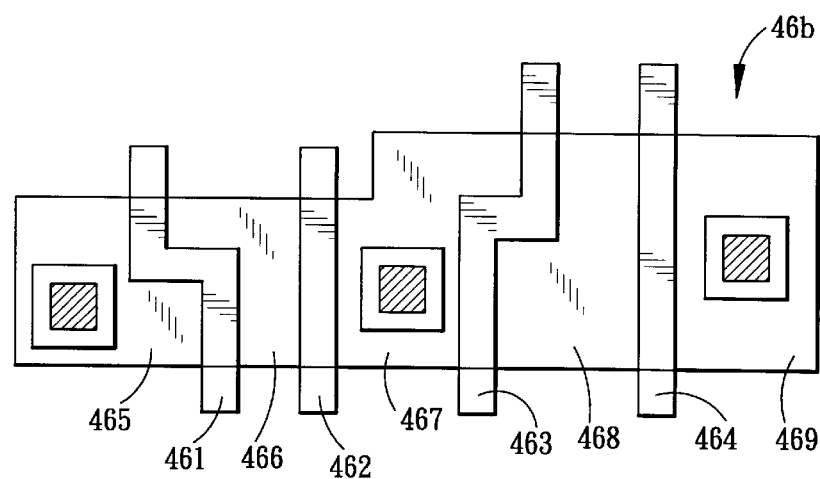
FIGS. 14A and 14B illustrate how an integrated circuit layout of a multiple-gate semiconductor device is split to obtain the integrated circuit layouts of two other semiconductor devices in accordance with the method and system of the preferred embodiment.
FIG. 14C is a flowchart illustrating the layout splitting operation according to the method and system of the preferred embodiment.
Figure 14:
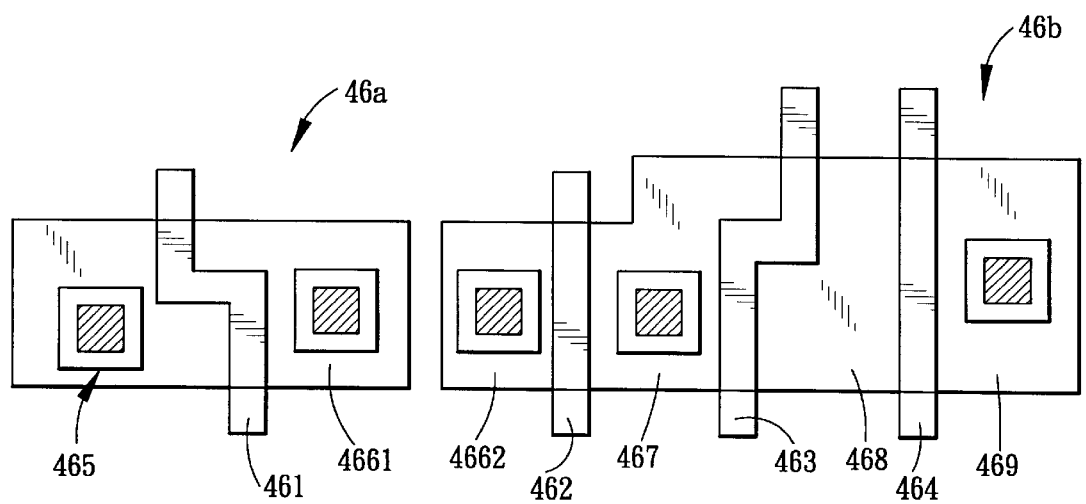
Figure 14:
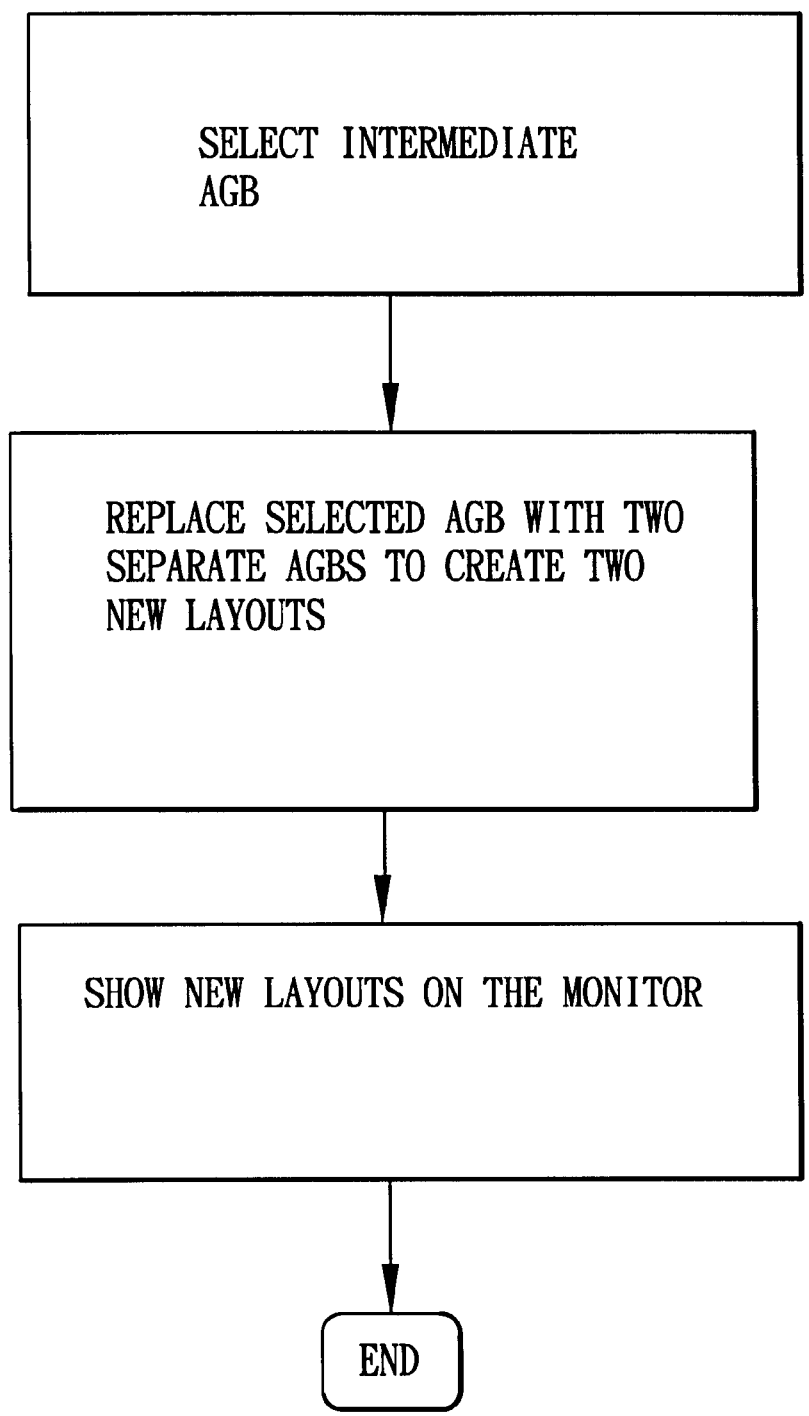

FIGS. 14A and 14B illustrate how the IC layouts 46a, 46b of two MG devices are obtained by splitting an original IC layout 46 that is comprised of four GGBs 461, 462, 463, 464 and five AGBs 465, 466, 467, 468, 469. FIG. 14C is a flowchart of the layout splitting operation according to the method and system of the preferred embodiment. In FIG. 14A, the user operates the user input device, e.g. the mouse 22 of FIG. 3, to select the working shape of the second AGB 466, which is disposed between the first and second GGBs 461, 462. Upon selection, the AGB creator 252 (see FIG. 16) is controlled so as to replace automatically the working shape of the second AGB 466 with the working shapes of two separate AGBs 4661, 4662 (see FIG. 14B) that are connected respectively to the working shapes of the first and second GGBs 461, 462 and that meet the minimum geometrical distances as defined by the MG-DRS in relation to the working shape of the respective adjacent one of the first and secondGGBs 461, 462. Thus, the IC layout 46 of FIG. 14A is split into two IC layouts 46a, 46b, which are shown on the monitor 20 (see FIG. 16), of two other MG devices. The IC layout 46a is comprised of a single GGB 461 and two AGBs 465, 4661. The IC layout 46b is comprised of three GGBs 462, 463, 464 and four AGBs 4662, 467, 468, 469.

Figure 15:
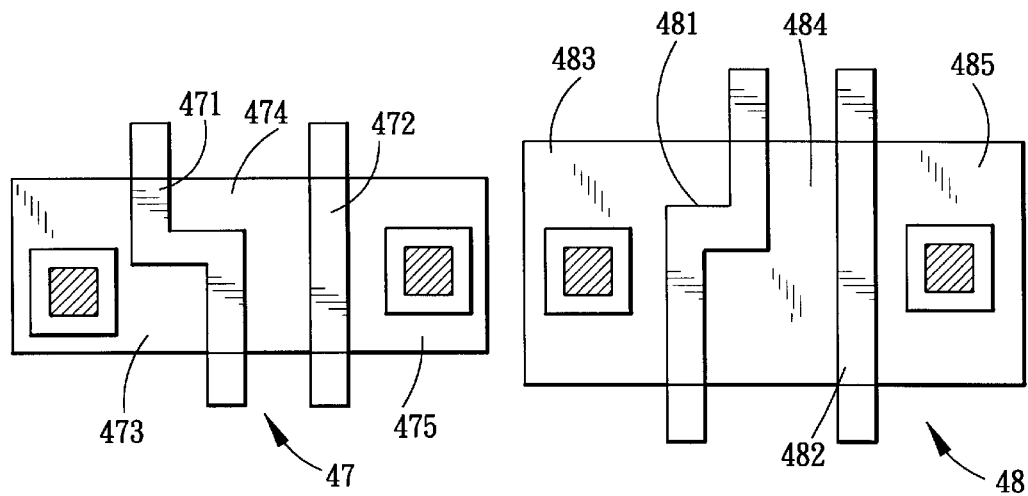
FIGS. 15A and 15B illustrate how the integrated circuit layouts of two multiple-gate semiconductor devices are merged to obtain the integrated circuit layout of another multiple-gate semiconductor device in accordance with the method and system of the preferred embodiment.
FIG. 15C is a flowchart illustrating the layout merging operation according to the method and system of the preferred embodiment.
Figure 15:
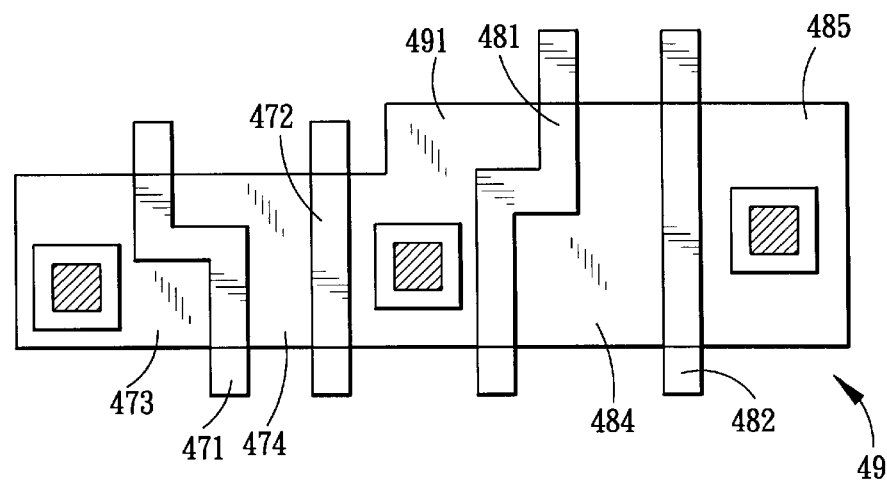
Figure 15:
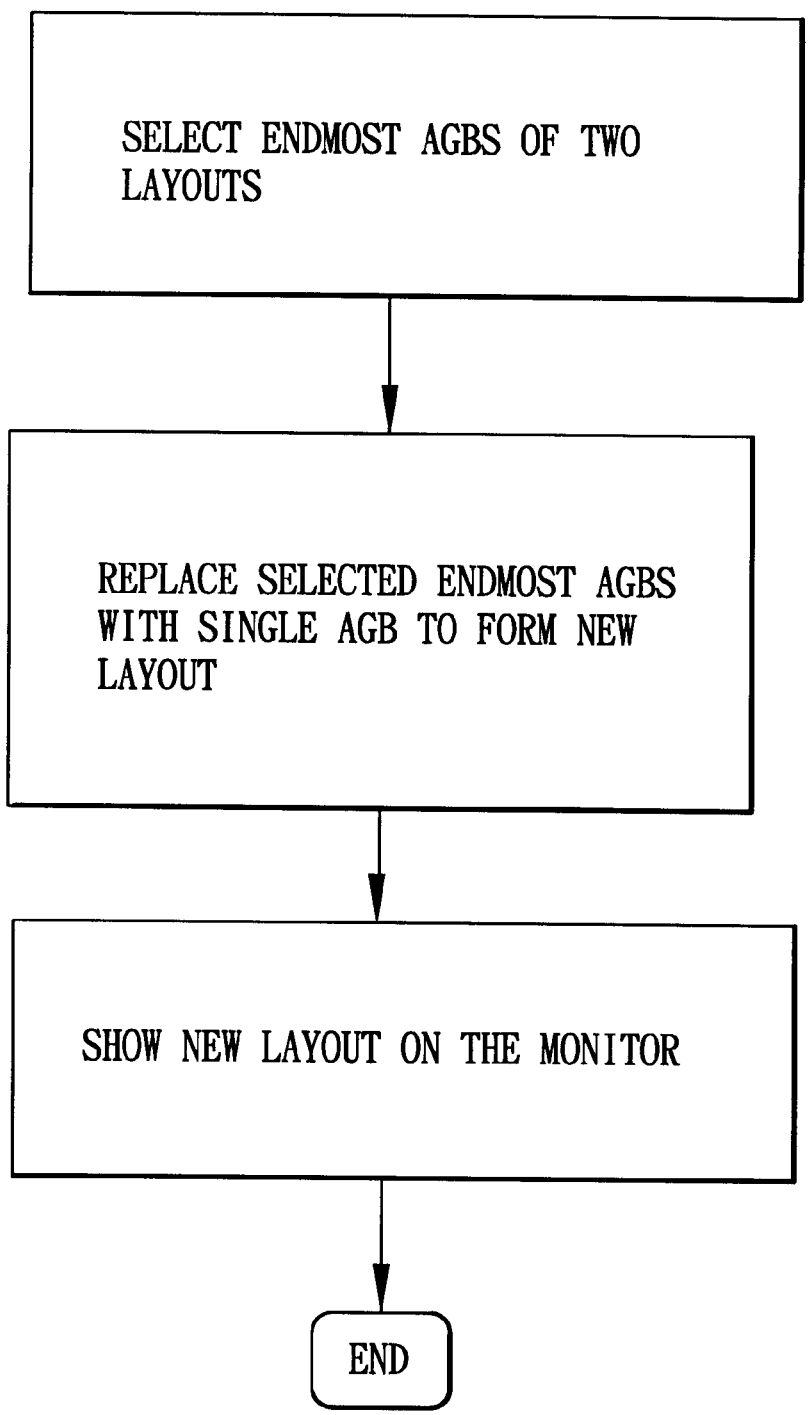

FIGS. 15A and 15B illustrate how the IC layouts 47, 48 of two MG devices are merged to obtain the IC layout 49 of a third MG device. FIG. 15C is a flowchart of the layout merging operation according to the method and system of the preferred embodiment. As shown in FIG. 15A, the IC layout 47 is comprised of two GGBs 471, 472 and three AGBs 473, 474, 475. The IC layout 48 is similarly comprised of two GGBs 481, 482 and three AGBs 483, 484, 485.

Initially, the user operates the user input device, e.g. the mouse 22 of FIG. 3, to select the working shape of the third AGB 475, which is disposed at the rightmost end of the IC layout 47, and the working shape of the first AGB 483, which is disposed at the leftmost end of the IC layout 48. Upon selection, the AGB creator 252 (see FIG. 16) is controlled so as to replace automatically the working shapes of the selected AGBs 475, 483 with the working shape of a single AGB 491 (see FIG. 15B) that interconnects the working shapes of the GGBs 472, 481 and that meets the minimum geometrical distances as defined by the MG-DRS. Thus, the IC layouts 47, 48 of FIG. 15A are merged to form the IC layout 49, which is shown on the monitor 20 (see FIG. 16), of a third MG device.

The layout merging operation is particularly useful in the preparation of IC layouts due to the benefits in layout area, speed and noise reduction.

It is noted that the IC layouts resulting from any of the aforesaid manipulation operations are also free of design rule violations. These user-friendly manipulation operations provide the layout designer with many alternatives when varying the IC layout of an MG device in order to optimize the layout area, thereby greatly relieving the burden commonly encountered during the construction and editing of the IC layouts of MG devices.

It has thus been shown that the method and system of the present invention permit parameter-based construction and user-friendly manipulation of the IC layouts of MG devices. Since the relevant design rules are applied during the construction and manipulation of the IC layouts, a "correct-by-construction" approach is employed so that the IC layouts thus constructed can be assured to be free of any design rule violations, thereby dramatically improving the layout design productivity. The object of the present invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A computer-implemented method for symbolically representing a physical integrated circuit layout of a multiple-gate semiconductor device, the layout being comprised of a plurality of gate glue-blocks interconnected by a plurality of active-layer glue-blocks, the method comprising the machine-executed steps of:
   (a) automatically creating working shapes of the gate glue-blocks according to user-defined gate glue-block parameters; and
   (b) automatically creating working shapes of the active-layer glue-blocks in accordance with the working shapes of adjacent ones of the gate glue-blocks, including the machine-executed steps of
      extracting relevant design rules of an applied fabrication technology from a fabrication technology file to determine minimum geometrical distances among the working shapes, and
      creating the working shapes of the active-layer glue-blocks such that the distances among the working shapes exceed the minimum geometrical distances as defined by the relevant design rules.

2. The method of claim 1, wherein, in step (a), the working shapes of the gate glue-blocks can be any one of a number of predetermined gate patterns.

3. The method of claim 2, wherein, in step (a), the user-defined gate glue-block parameters include lengths and widths of the working shapes of the gate glue-blocks, the gate patterns of the working shapes of the gate glue-blocks, and offset values for the working shapes of the gate glue-blocks, the offset value being a distance to be formed in the lengthwise direction between an edge of the working shape of one of the gate glue-blocks and an edge of the working shape of another one of the gate glue-blocks that is adjacent to said one of the gate glue-blocks.

4. The method of claim 3, wherein, in step (a), the user-defined gate glue-block parameters are imported from a user input device.

5. The method of claim 1, wherein step (b) further includes the machine-executed steps of
   allowing the user to define which ones of the active-layer glue-blocks are to be provided with a contact unit,
   adjusting geometry of the working shapes of the active-layer glue-blocks that are to be provided with the contact unit to permit accommodation of the contact unit therein such that the distances between the contact unit and the working shapes of the gate and active-layer glue-blocks exceed the minimum geometrical distances as defined by the relevant design rules of the applied fabrication technology from the fabrication technology file, and
   providing the contact unit inside the working shapes of the defined ones of the active-layer glue-blocks.

6. The method of claim 5, wherein step (b) further includes the machine-executed step of allowing the user to further define the contact unit to be provided inside the working shape of each of the defined ones of the active-layer glue-blocks to be one of:
   a single-contact type, where the contact unit provided inside the working shape of the active-layer glue-block includes a single contact;
   a user-defined contact array type, where the contact unit provided inside the working shape of the active-layer glue-block includes a contact array defined by the user; and
   a maximum contact array, where the contact unit provided inside the working shape of the active-layer glue-block includes a contact array having a maximum number of contacts that meets the minimum geometrical distances as defined by the relevant design rules.

7. The method of claim 1, further comprising the machine-executed steps of:
   allowing the user to modify the user-defined gate glue-block parameters;
   automatically adjusting geometry of the working shapes of the gate glue-blocks according to the modified user-defined gate glue-block parameters; and
   automatically adjusting geometry of the working shapes of the active-layer glue-blocks in accordance with the working shapes of adjusted adjacent ones of the gate glue-blocks such that the distances among the working shapes exceed the minimum geometrical distances as defined by the relevant design rules.

8. The method of claim 6, further comprising the machine-executed step of allowing the user to adjust geometry of the working shapes of the active-layer glue-blocks and to redefine the contact unit inside the working shapes of the active-layer glue-blocks.

9. The method of claim 1, further comprising the machine-executed steps of:
   allowing the user to move the working shape of each of the gate glue-blocks relative to the working shapes of adjacent ones of the gate glue-blocks; and automatically adjusting geometry of the working shapes of the active-layer glue-blocks in accordance with new positions of the working shapes of adjacent ones of the gate glue-blocks such that the distances among the working shapes exceed the minimum geometrical distances as defined by the relevant design rules.

10. The method of claim 1, further comprising the machine-executed steps of:
allowing the user to adjust geometry of the working shape of each of the gate glue-blocks; and
automatically adjusting geometry of the working shapes of the active-layer glue-blocks in accordance with the working shapes of adjusted adjacent ones of the gate glue-blocks such that the distances among the working shapes exceed the minimum geometrical distances as defined by the relevant design rules.

11. The method of claim 1, further comprising the machine-executed steps of:
allowing the user to select the working shape of one of the active-layer glue-blocks that is disposed between the working shapes of two adjacent ones of the gate glue-blocks in the layout; and
automatically replacing the working shape of the selected one of the active-layer glue-blocks with the working shapes of two separate active-layer glue-blocks that are connected respectively to the working shapes of the two adjacent ones of the gate glue-blocks and that meet the minimum geometrical distances as defined by the relevant design rules in relation to the working shape of the respective adjacent one of the gate glue-blocks;
whereby, the layout of the multiple-gate semiconductor device is split to obtain the layouts of two other semiconductor devices.

12. The method of claim 1, further comprising the step of:
allowing the user to select the working shape of an endmost one of the active-layer glue-blocks in the layout of a first multiple-gate semiconductor device, and the working shape of an endmost one of the active-layer glue-blocks in the layout of a second multiple-gate semiconductor device; and
automatically replacing the working shapes of the selected endmost ones of the active-layer glue-blocks in the layouts of the first and second multiple-gate semiconductor devices with the working shape of a single active-layer glue-block that meets the minimum geometrical distances as defined by the relevant design rules, thereby merging the layouts of the first and second multiple-gate semiconductor devices to form the layout of a third multiple-gate semiconductor device.

13. A method for constructing and manipulating a physical integrated circuit layout of a multiple-gate semiconductor device, the layout being comprised of a plurality of gate glue-blocks interconnected by a plurality of active-layer glue-blocks, the method comprising the machine-executed steps of:
(a) importing user-defined gate glue-block parameters from a user input device;
(b) creating working shapes of the gate glue-blocks according to the user-defined gate glue-block parameters;
(c) creating working shapes of the active-layer glue-blocks in accordance with the working shapes of adjacent ones of the gate glue-blocks, including the machine-executed steps of
extracting relevant design rules of an applied fabrication technology from a fabrication technology file to determine minimum geometrical distances among the working shapes, and
creating the working shapes of the active-layer glue-blocks such that the distances among the working shapes exceed the minimum geometrical distances as defined by the relevant design rules; and
(d) showing the layout thus constructed on a computer monitor.

14. The method of claim 13, wherein, in step (b), the working shapes of the gate glue-blocks can be any one of a number of predetermined gate patterns.

15. The method of claim 14, wherein, in step (a), the user-defined gate glue-block parameters include lengths and widths of the working shapes of the gate glue-blocks, the gate patterns of the working shapes of the gate glue-blocks, and offset values for the working shapes of the gate glue-blocks, the offset value being a distance to be formed in the lengthwise direction between an edge of the working shape of one of the gate glue-blocks and an edge of the working shape of another one of the gate glue-blocks that is adjacent to said one of the gate glue-blocks.

16. The method of claim 13, wherein step (c) further includes the machine-executed steps of
adjusting geometry of the working shapes of the active-layer glue-blocks which were defined by the user, through the user input device, as to be provided with a contact unit to permit accommodation of the contact unit therein such that the distances between the contact unit and the working shapes of the gate and active-layer glue-blocks exceed the minimum geometrical distances as defined by the relevant design rules of the applied fabrication technology from the fabrication technology file, and
providing the contact unit inside the working shapes of the defined ones of the active-layer glue-blocks.

17. The method of claim 16, wherein, in step (c), the contact unit to be provided inside the working shape of each of the defined ones of the active-layer glue-blocks is further defined by the user, through the user input device, to be one of:
a single-contact type, where the contact unit provided inside the working shape of the active-layer glue-block includes a single contact;
a user-defined contact array type, where the contact unit provided inside the working shape of the active-layer glue-block includes a contact array defined by the user; and
a maximum contact array, where the contact unit provided inside the working shape of the active-layer glue-block includes a contact array having a maximum number of contacts that meets the minimum geometrical distances as defined by the relevant design rules.

18. The method of claim 13, further comprising the machine-executed steps of:
adjusting geometry of the working shapes of the gate glue-blocks according to modified user-defined gate glue-block parameters imported from the user input device;
adjusting geometry of the working shapes of the active-layer glue-blocks in accordance with the working shapes of adjusted adjacent ones of the gate glue-blocks such that the distances among the working shapes exceed the minimum geometrical distances as defined by the relevant design rules; and showing an adjusted layout thus constructed on the computer monitor.

19. The method of claim 17, further comprising the machine-executed steps of:
adjusting geometry of the working shapes of the active-layer glue-blocks and redefining the contact unit inside the working shapes of the active-layer glue-blocks according to operation of the user input device by the user; and
showing an adjusted layout thus constructed on the computer monitor.

20. The method of claim 13, further comprising the machine-executed steps of:
moving the working shape of each of the gate glue-blocks relative to the working shapes of adjacent ones of the gate glue-blocks according to operation of the user input device by the user;
adjusting geometry of the working-shapes of the active-layer glue-blocks in accordance with new positions of the working shapes of adjacent ones of the gate glue-blocks such that the distances among the working shapes exceed the minimum geometrical distances as defined by the relevant design rules; and
showing an adjusted layout thus constructed on the computer monitor.

21. The method of claim 13, further comprising the machine executed steps of:
adjusting geometry of the working shape of each of the gate glue-blocks according to operation of the user input device by the user;
adjusting geometry of the working shapes of the active-layer glue-blocks in accordance with the working shapes of adjusted adjacent ones of the gate glue-blocks such that the distances among the working shapes exceed the minimum geometrical distances as defined by the relevant design rules; and
showing an adjusted layout thus constructed on the computer monitor.

22. The method of claim 13, further comprising the machine-executed steps of:
replacing the working shape of one of the active-layer glue-blocks, disposed between the working shapes of two adjacent ones of the gate glue-blocks in the layout and selected by the user via the user input device, with the working shapes of two separate active-layer glue-blocks that are connected respectively to the working shapes of the two adjacent ones of the gate glue-blocks and that meet the minimum geometrical distances as defined by the relevant design rules in relation to the working shape of the respective adjacent one of the gate glue-blocks, thereby splitting the layout of the multiple-gate semiconductor device to obtain the layouts of two other semiconductor devices; and
showing the layouts of the two other semiconductor devices on the computer monitor.

23. The method of claim 13, further comprising the step of:
replacing the working shape of an endmost one of the active-layer glue-blocks in the layout of a first multiple-gate semiconductor device, and the working shape of an endmost one of the active-layer glue-blocks in the layout of a second multiple-gate semiconductor device, the endmost ones of the active-layer glue-blocks in the layouts of the first and second multiple-gate semiconductor devices being selected by the user through the user input device, with the working shape of a single active-layer glue-block that meets the minimum geometrical distances as defined by the relevant design rules, thereby merging the layouts of the first and second multiple-gate semiconductor devices to form the layout of a third multiple-gate semiconductor device; and
showing the layout of the third multiple-gate semiconductor device on the computer monitor.

24. A computer system for the automated design of a physical integrated circuit layout of a multiple-gate semiconductor device, the layout being comprised of a plurality of gate glue-blocks interconnected by a plurality of active-layer glue-blocks, the computer system comprising:
first means for automatically creating working shapes of the gate glue-blocks according to user-defined gate glue-block parameters; and
second means, associated operably with said first means, for automatically creating working shapes of the active-layer glue-blocks in accordance with the working shapes of adjacent ones of the gate glue-blocks, wherein the distances among the working shapes exceed minimum geometrical distances as defined by relevant design rules of an applied fabrication technology.

25. The computer system of claim 24, wherein said second means includes fabrication technology data storage means for storing the design rules therein, means for extracting the relevant design rules from said data storage means, and means for creating the working shapes of the active-layer glue-blocks.

26. The computer system of claim 24, wherein the working shapes of the gate glue-blocks can be any one of a number of predetermined gate patterns.

27. The computer system of claim 26, wherein the user-defined gate glue-block parameters include lengths and widths of the working shapes of the gate glue-blocks, the gate patterns of the working shapes of the gate glue-blocks, and offset values for the working shapes of the gate glue-blocks, the offset value being a distance to be formed in the lengthwise direction between an edge of the working shape of one of the gate glue-blocks and an edge of the working shape of another one of the gate glue-blocks that is adjacent to said one of the gate glue-blocks.

28. The computer system of claim 27, further comprising a user input device associated operably with said first means and providing the user-defined gate glue-block parameters to said first means.

29. The computer system of claim 24, wherein said second means includes:
means for allowing the user to define which ones of the active-layer glue-blocks are to be provided with a contact unit;
means for adjusting geometry of the working shapes of the active-layer glue-blocks that are to be provided with the contact unit to permit accommodation of the contact unit therein such that the distances between the contact unit and the working shapes of the gate and active-layer glue-blocks exceed the minimum geometrical distances as defined by the relevant design rules; and,
means for providing the contact unit inside the working shapes of the defined ones of the active-layer glue-blocks.

30. The computer system of claim 29, wherein said second means includes means for allowing the user to further define the contact unit to be provided inside the working shape of each of the defined ones of the active-layer glue-blocks to be one of:
- a single-contact type, where the contact unit provided inside the working shape of the active-layer glue-block includes a single contact;
- a user-defined contact array type, where the contact unit provided inside the working shape of the active-layer glue-block includes a contact array defined by the user; and
- a maximum contact array, where the contact unit provided inside the working shape of the active-layer glue-block includes a contact array having a maximum number of contacts that meets the minimum geometrical distances as defined by the relevant design rules.

31. The computer system of claim 24, further comprising:
third means for allowing the user to modify the user-defined gate glue-block parameters;
fourth means, associated operably with said third means, for automatically adjusting geometry of the working shapes of the gate glue-blocks according to the modified user-defined gate glue-block parameters; and
fifth means, associated operably with said fourth means, for automatically adjusting geometry of the working shapes of the active-layer glue-blocks in accordance with the working shapes of adjusted adjacent ones of the gate glue-blocks such that the distances among the working shapes exceed the minimum geometrical distances as defined by the relevant design rules.

32. The computer system of claim 30, further comprising means for allowing the user to adjust geometry of the working shapes of the active-layer glue-blocks and to redefine the contact unit inside the working shapes of the active-layer glue-blocks.

33. The computer system of claim 24, further comprising:
third means for allowing the user to move the working shape of each of the gate glue-blocks relative to the working shapes of adjacent ones of the gate glue-blocks; and
fourth means, associated operably with said third means, for automatically adjusting geometry of the working shapes of the active-layer glue-blocks in accordance with new positions of the working shapes of adjacent ones of the gate glue-blocks such that the distances among the working shapes exceed the minimum geometrical distances as defined by the relevant design rules.

34. The computer system of claim 24, further comprising:
third means for allowing the user to adjust geometry of the working shape of each of the gate glue-blocks; and
fourth means, associated operably with said third means, for automatically adjusting geometry of the working shapes of the active-layer glue-blocks in accordance with the working shapes of adjusted adjacent ones of the gate glue-blocks such that the distances among the working shapes exceed the minimum geometrical distances as defined by the relevant design rules.

35. The computer system of claim 24, further comprising:
third means for allowing the user to select the working shape of one of the active-layer glue-blocks that is disposed between the working shapes of two adjacent ones of the gate glue-blocks in the layout; and
fourth means, associated operably with said third means, for automatically replacing the working shape of the selected one of the active-layer glue-blocks with the working shapes of two separate active-layer glue-blocks that are connected respectively to the working shapes of the two adjacent ones of the gate glue-blocks and that meet the minimum geometrical distances as defined by the relevant design rules in relation to the working shape of the respective adjacent one of the gate glue-blocks;
whereby, the layout of the multiple-gate semiconductor device is split to obtain the layouts of two other semiconductor devices.

36. The computer system of claim 24, further comprising:
third means for allowing the user to select the working shape of an endmost one of the active-layer glue-blocks in the layout of a first multiple-gate semiconductor device, and the working shape of an endmost one of the active-layer glue-blocks in the layout of a second multiple-gate semiconductor device; and
fourth means, associated operably with said third means, for automatically replacing the working shapes of the selected endmost ones of the active-layer glue-blocks in the layouts of the first and second multiple-gate semiconductor devices with the working shape of a single active-layer glue-block that meets the minimum geometrical distances as defined by the relevant design rules, thereby merging the layouts of the first and second multiple-gate semiconductor devices to form the layout of a third multiple-gate semiconductor device.

37. A system for the automated construction and manipulation of a physical integrated circuit layout of a multiple-gate semiconductor device, the layout being comprised of a plurality of gate glue-blocks interconnected by a plurality of active-layer glue-blocks, the system comprising:
a monitor for showing the layout thereon;
a user input device operable so as to provide user-defined gate glue-block parameters; and
a shape creator connected to said monitor and said user input device and operable so as to create the layout shown on the monitor, said shape creator including
a gate glue-block creator for creating working shapes of the gate glue-blocks according to the user-defined gate glue-block parameters imported from said user input device, and
an active-layer glue-block creator, associated operably with said gate glue-block creator, for creating working shapes of the active-layer glue-blocks in accordance with the working shapes of adjacent ones of the gate glue-blocks, wherein the distances among the working shapes exceed minimum geometrical distances as defined by relevant design rules of an applied fabrication technology.

38. The system of claim 37, further comprising a data storage device for storing the design rules therein, said active-layer glue-block creator including means for extracting the relevant design rules from said data storage means, and means for creating the working shapes of the active-layer glue-blocks.

39. The system of claim 37, wherein the working shapes of the gate glue-blocks can be any one of a number of predetermined gate patterns.

40. The system of claim 39, wherein the user-defined gate glue-block parameters include lengths and widths of the working shapes of the gate glue-blocks, the gate patterns of the working shapes of the gate glue-blocks, and offset values for the working shapes of the gate glue-blocks, the offset value being a distance to be formed in the lengthwise direction between an edge of the working shape of one of the gate glue-blocks and an edge of the working shape of another one of the gate glue-blocks that is adjacent to said one of the gate glue-blocks.

41. The system of claim 37, wherein said user input device is operable so as to define which ones of the active-layer glue-blocks are to be provided with a contact unit, and so as to enable said active-layer glue-bick creator to adjust geometry of the working shapes of the active-layer glue-blocks that are to be provided with the contact unit to permit accommodation of the contact unit therein such that the distances between the contact unit and the working shapes of the gate and active-layer glue-blocks exceed the minimum geometrical distances as defined by the relevant design rules, and provide the contact unit inside the working shapes of the defined ones of the active-layer glue-blocks.

42. The system of claim 41, wherein said user input device is operable so as to further define the contact unit to be provided inside the working shape of each of the defined ones of the active-layer glue-blocks to be one of:

a single-contact type, where the contact unit provided inside the working shape of the active-layer glue-block includes a single contact;

a user-defined contact array type, where the contact unit provided inside the working shape of the active-layer glue-block includes a contact array defined by the user; and a maximum contact array, where the contact unit provided inside the working shape of the active-layer glue-block includes a contact array having a maximum number of contacts that meets the minimum geometrical distances as defined by the relevant design rules.

43. The system of claim 37, wherein:

said user input device is further operable so as to modify the user-defined gate glue-block parameters, and so as to control said gate glue-block creator to adjust geometry of the working shapes of the gate glue-blocks according to the modified user-defined gate glue-block parameters, and control said active-layer glue-block creator to adjust geometry of the working shapes of the active-layer glue-blocks in accordance with the working shapes of adjusted adjacent ones of the gate glue-blocks such that the distances among the working shapes exceed the minimum geometrical distances as defined by the relevant design rules;

said monitor showing thereon an adjusted layout thus constructed by said shape creator.

44. The system of claim 42, wherein said user input device is further operable so as to enable said active-layer glue-block creator to adjust geometry of the working shapes of the active-layer glue-blocks and to redefine the contact unit inside the working shapes of the active-layer glue-blocks, said monitor showing thereon an adjusted layout thus constructed by said shape creator.

45. The system of claim 37, wherein said user input device is operable so as to control said gate glue-block creator to move the working shape of each of the gate glue-blocks relative to the working shapes of adjacent ones of the gate glue-blocks, and so as to control said active-layer glue-block creator to adjust geometry of the working shapes of the active-layer glue-blocks in accordance with new positions of the working shapes of adjacent ones of the gate glue-blocks such that the distances among the working shapes exceed the minimum geometrical distances as defined by the relevant design rules, said monitor showing thereon an adjusted layout thus constructed by said shape creator.

46. The system of claim 37, wherein said user input device is operable so as to control said gate glue-block creator to adjust geometry of the working shape of each of the gate glue-blocks, and so as to control said active-layer glue-block creator to adjust geometry of the working shapes of the active-layer glue-blocks in accordance with the working shapes of adjusted adjacent ones of the gate glue-blocks such that the distances among the working shapes exceed the minimum geometrical distances as defined by the relevant design rules, said monitor showing thereon an adjusted layout thus constructed by said shape creator.

47. The system of claim 37, wherein said user input device is operable so as to select the working shape of one of the active-layer glue-blocks that is disposed between the working shapes of two adjacent ones of the gate glue-blocks in the layout, and so as to control said active-layer glue-block creator to replace the working shape of the selected one of the active-layer glue-blocks with the working shapes of two separate active-layer glue-blocks that are connected respectively to the working shapes of the two adjacent ones of the gate glue-blocks and that meet the minimum geometrical distances as defined by the relevant design rules in relation to the working shape of the respective adjacent one of the gate glue-blocks, thereby splitting the layout of the multiple-gate semiconductor device to obtain the layouts of two other semiconductor devices; said monitor showing the layouts of the two other semiconductor devices thereon.

48. The system of claim 37, wherein said user input device is operable so as to select the working shape of an endmost one of the active-layer glue-blocks in the layout of a first multiple-gate semiconductor device, and the working shape of an endmost one of the active-layer glue-blocks in the layout of a second multiple-gate semiconductor device, and so as to control said active-layer glue-block creator to replace the working shapes of the selected endmost ones of the active-layer glue-blocks in the layouts of the first and second multiple-gate semiconductor devices with the working shape of a single active-layer glue-block that meets the minimum geometrical distances as defined by the relevant design rules, thereby merging the layouts of the first and second multiple-gate semiconductor devices to form the layout of a third multiple-gate semiconductor device; said monitor showing the layout of the third multiple-gate semiconductor device thereon.

* * * * *